US006852592B2

(12) United States Patent
Lee et al.

(10) Patent No.: US 6,852,592 B2
(45) Date of Patent: Feb. 8, 2005

(54) METHODS FOR FABRICATING SEMICONDUCTOR DEVICES

(75) Inventors: Sung-Kwon Lee, Kyoungki-do (KR); Min-Suk Lee, Kyoungki-do (KR); Sang-Ik Kim, Kyoungki-do (KR)

(73) Assignee: Hynix Semiconductor, Inc., Kyoungki-Do (KR)

( * ) Notice: Subject to any disclaimer, the term of this patent is extended or adjusted under 35 U.S.C. 154(b) by 0 days.

(21) Appl. No.: 10/452,347

(22) Filed: Jun. 2, 2003

(65) Prior Publication Data

US 2004/0009656 A1 Jan. 15, 2004

(30) Foreign Application Priority Data

Jun. 3, 2002 (KR) ................................ 10-2002-0030996
Jun. 29, 2002 (KR) ................................ 10-2002-0037226

(51) Int. Cl.⁷ ......................................... H01L 21/8242
(52) U.S. Cl. ........................ 438/253; 438/256; 438/396; 438/399; 438/638; 438/640; 438/672; 438/673; 438/704
(58) Field of Search ................................. 438/239, 253, 438/256, 396, 399, 638–641, 672–673, 675, 704

(56) References Cited

U.S. PATENT DOCUMENTS

| | | | | |
|---|---|---|---|---|
| 5,591,675 A | * | 1/1997 | Kim et al. ................. | 438/640 |
| 5,731,236 A | * | 3/1998 | Chou et al. ................. | 438/253 |
| 6,413,816 B2 | * | 7/2002 | Kim ........................... | 438/253 |
| 2002/0064945 A1 | * | 5/2002 | Choi et al. .................. | 438/640 |
| 2003/0122174 A1 | * | 7/2003 | Fukuzumi ................... | 257/306 |

OTHER PUBLICATIONS

Wolf, Ph.D., Stanley, Richard Tauber, Ph.D., "Multi–Level Interconnect Technology for VLSI and ULSI," Semiconductor Processing for the VLSI Era—vol. 2: Process Integration, Lattice Press, 1986, pp. 194–199.*

* cited by examiner

Primary Examiner—Amir Zarabian
Assistant Examiner—Toniae M. Thomas
(74) Attorney, Agent, or Firm—Marshall, Gerstein & Borun LLP

(57) ABSTRACT

A method for fabricating a semiconductor device includes forming a plurality of first plugs contacted to a substrate by passing through a first inter-layer insulation layer; forming a second inter-layer insulation layer on the first plugs; forming a conductive pattern contacted to a group of the first plugs by etching selectively the second inter-layer insulation layer; and forming a contact hole exposing a surface of the first plug that is not contacted to the conductive pattern by etching selectively the second insulation layer with use of a dry-type and wet-type etch process, wherein an attack barrier layer is formed on between the first inter-layer insulation layer and the second inter-layer insulation layer to thereby prevent an incidence of attack to the first interlayer insulation layer contacted to the first plug during the wet-type etch process for forming the contact hole.

20 Claims, 10 Drawing Sheets

METHODS FOR FABRICATING SEMICONDUCTOR DEVICES

BACKGROUND

1. Technical Field

A method for fabricating a semiconductor device is disclosed and, more particularly, a method for fabricating a semiconductor device that prevents degradation of the semiconductor device caused by damage to an insulation layer during a process for forming an opening for a storage node contact.

2. Description of the Related Art

There have been numerous attempts at achieving higher integration and higher performance of semiconductor devices. With respect to the higher integration, it is essential to develop technologies for obtaining contact regions as well as for enhancing gap-filled properties.

FIG. 1 is a plan view schematically illustrating a conductive pattern including a word line for forming a bit line and the bit line. In FIG. 1, a plurality of gate electrodes, e.g., word lines W/L, are aligned in one direction, and a plurality of bit lines B/L are aligned in another direction to thereby cross or intersect the word lines W/L. A plurality of landing plug contacts (LPCs) are first formed by a LPC1 process. A bit line B/L is contacted to an active region (not shown) of a substrate through one of landing plug contacts (LPC) and a bit line contact (BLC). Some of the LPCs are coupled to storage node contacts (SNCs) in order to form storage node capacitors.

FIGS. 2A to 2F are cross-sectional views along lines X–X' and Y–Y' of FIG. 1. FIGS. 2A to 2F show a method for fabricating a semiconductor device according to the prior art.

Referring to FIG. 2A, a gate electrode 11 is formed on a substrate 10 containing various elements of the semiconductor device. Specifically, the gate electrode 11 is formed with a single or stack layer of tungsten or polysilicon. A gate insulation layer (not shown) is formed at an interface between the gate electrode 11 and the substrate 10. On top of the gate electrode 11, a nitride-based hard mask (not shown) having a different etch selectivity ratio from an oxide-based inter-layer insulation layer is formed to protect the gate electrode 11 during a self align contact (SAC) process and to obtain an appropriate etch profile during the SAC process.

Next, such technique as an ion implantation technique and so forth is performed to form an impurity adhesion layer such as a source/drain adhesion, i.e., the active region (not shown), on a portion of the substrate 10 between the gate electrodes 11. A nitride-based insulation layer 11' for a spacer (hereinafter referred to as spacer insulation layer) is formed in such a manner to encompass lateral sides of the gate electrode 11.

Referring to FIG. 2B, a typical oxide based material or a flowable oxide material is used to form a first inter-layer insulation layer 12 of which top portion is planarized. An anti-reflection layer (not shown), especially, an organic anti-reflection layer is coated on top of the first inter-layer insulation layer 12. Then, a photoresist is coated on the anti-reflection layer and, a photolithography process is performed with use of a light source of KrF or ArF to form a first photoresist pattern 13 for forming LPCs.

The photoresist is coated on the anti-reflection layer with a predetermined thickness. Afterwards, a predetermined portion of the photoresist is selectively photo-exposed by using a light source such as ArF (not shown) and a predetermined reticle (not shown). Subsequently, a developing process is performed on the remaining portions. Remnants generated after performing a subsequent etch process are removed through a cleaning process to thereby form the first photoresist pattern 13 (FIG. 2B).

After the photoresist coating, an additional process such as an electron beam scanning or an ion implantation of Ar is performed to strengthen the tolerance of the first photoresist pattern 13 to a subsequent etch process.

Next, the first inter-layer insulation layer 12 is selectively etched with use of the first photoresist pattern 13 as an etch mask. Then, a LPC1 process is performed to expose a surface of the substrate 10 to form the contact holes shown at 14.

The first photoresist pattern 13 is removed through a photoresist strip process, and etch remnants existing within the contact hole 14 are removed by a cleaning process. Then, a contact material is contacted to the contact hole 14 by using a polysilicon deposition or a selective epitaxial silicon growth technique. Afterwards, a chemical mechanical polishing (CMP) process or a blanket-etch process forms the isolated plugs 15 shown in FIG. 2C.

Referring to FIG. 2D, a second inter-layer insulation layer 16 is formed on the above structure including the plugs 15, and a second photoresist pattern 17 for defining a bit line contact is formed. The second inter-layer insulation layer 16 is selectively etched by using the second photoresist pattern 17 as an etch mask so that a bit line contact hole 18 is formed that exposes a surface of the plug 15.

Next, as seen in FIG. 2E, a bit line contact plug 19 contacted with a surface of the opened plug 15 is formed, and then, a bit line 24 is formed by stacking a nitride based hard mask 21 on a layer 20 made of tungsten, tungsten nitride or polysilicon.

Turning to FIG. 2F, a third photoresist pattern 22 is formed for exposing a surface of the plug 15 for a SNC. The photoresist pattern 22 is then used as an etch mask when the second inter-layer insulation layer 16 is selectively etched. From this selective etch of the second inter-layer insulation layer 16, storage node contact holes 23 are formed.

Meanwhile, in case of a LPC2 process for forming SNCs, the typical SAC process is used. Thus, an etch profile of the storage node contact hole 23 is sloped and is narrower toward the bottom of the hole 23. As a result, in addition to the typical SAC process, a wet-type etch process is simultaneously performed during the LPC2 process in order to prevent any increase in the contact resistance. Consequently, it is possible to secure a contact area, i.e., a critical dimension (CD).

However, the first and the second inter-layer insulation layer 12 and 16 typically use oxide layer materials, e.g., boro-phospho-silicate glass (BPSG), and these materials have a higher etch ratio to a buffered oxide etchant (BOE) or HF which are both used in the wet-type etch processes. Because of this high etch ratio, as shown in FIG. 2F, the first inter-layer insulation layer 12 is prone to an attack or erosion shown at 26.

The erosion 26 can induce an electric short with the storage node, bit line or other conductive wires, thereby deteriorating performances of the semiconductor device.

FIG. 3 is a diagram further illustrating problems arising in the prior art. As shown, during a formation of a nitride layer 25 for producing a spacer for the bit line 24 (hereinafter referred to as bit line spacer), voids 26 occur at a portion where the erosion 26 to the first inter-layer insulation layer 12 is generated. This void effect becomes a critical factor that gives rise to an electric short between the electrodes and reduces yields of the semiconductor devices.

In order to prevent the erosion shown at 26, one method decreases the CD of the first inter-layer insulation layer 12 during the LPC1 process. However, this technique is practically impossible due to difficulties in obtaining sufficient spaces for isolating each device and in applying the SAC process.

Furthermore, it is difficult to increase the width of the bit line in practice due to difficulties in obtaining a CD of the bottom side of the contact and a deterioration of the gap-fill properties during the storage node contact formation process.

Accordingly, it is necessary to develop a technology capable of preventing the attack or erosion of bottom layers caused by wet-type etching performed in the course of storage node contact formation.

SUMMARY OF THE DISCLOSURE

Methods for fabricating semiconductor devices are disclosed which are capable of preventing an incidence of attack or erosion to bottom layers during wet-type etching performed in the course of a storage node contact formation.

A disclosed method for fabricating a semiconductor device comprises forming a plurality of first plugs in contact with a substrate that passes through a first inter-layer insulation layer; forming a second inter-layer insulation layer on the first plugs; forming a conductive pattern in contact with a group of the first plugs by etching selectively through the second inter-layer insulation layer; and forming a contact hole that exposes a surface of the first plug that is not in contact with the conductive pattern by etching selectively through the second insulation layer with a dry-type and wet-type etch process, wherein an attack barrier layer is formed between the first inter-layer insulation layer and the second inter-layer insulation layer to prevent an incidence of attack or erosion of the first interlayer insulation layer in contact with the first plug during the wet-type etch process for forming the contact hole.

Another disclosed method for fabricating a semiconductor device comprises forming a plurality of first plugs in contact with a substrate by passing through a first inter-layer insulation layer; forming an attack barrier layer on the plurality of the first plugs in order to prevent the first inter-layer insulation layer from being attacked or eroded during a subsequent wet-type etch process; forming a second inter-layer insulation layer on the attack barrier layer; forming a conductive pattern contact with a group of the plurality of the first plugs by passing through the second inter-layer insulation layer; and etching selectively the second inter-layer insulation layer and the attack barrier layer by employing a dry-type and wet-type etch process to form a contact hole that exposes a surface of the first plug that is not in contact with the conductive pattern.

Yet another disclosed method for fabricating a semiconductor device comprises forming, sequentially, a first inter-layer insulation layer and an attack barrier layer on a substrate, the attack barrier layer preventing the first inter-layer insulation layer from being attacked or eroded during a subsequent wet-type etch process; forming a plurality of plugs of which top portion is planarized with the attack barrier layer, the plugs in contact with the substrate by passing through the attack barrier layer and the first inter-layer insulation layer; forming a second inter-layer insulation layer on the above resultant structure including the plug; forming a conductive pattern in contact with at least some of the plurality of the plugs by passing through the second inter-layer insulation layer; and etching selectively the second inter-layer insulation layer by using a dry-type and wet-type etch process to form a contact hole exposing a surface of the plug that is not in contact with the conductive pattern.

BRIEF DESCRIPTION OF THE DRAWINGS

The above and other features of the disclosed methods will become apparent from the following description of the preferred embodiments in conjunction with the accompanying drawings, wherein.

DETAILED DESCRIPTION OF THE PRESENTLY PREFERRED EMBODIMENTS

Methods for fabricating semiconductor devices are disclosed that are capable of preventing the bottom layers from being attacked or eroded during a wet-type etching performed in the course of a storage node contact formation.

Figure 1:
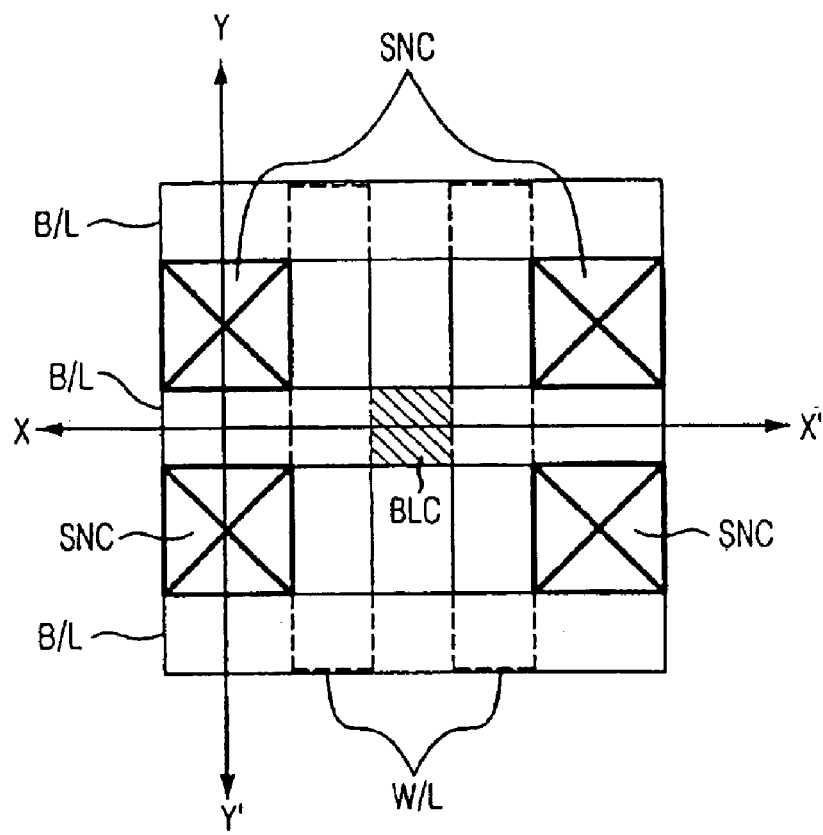
FIG. 1 is a plan view schematically illustrating a conductive pattern of a semiconductor device including a word line and a bit line formed by either prior art processes or the processes disclosed herein.
Figure 2A:
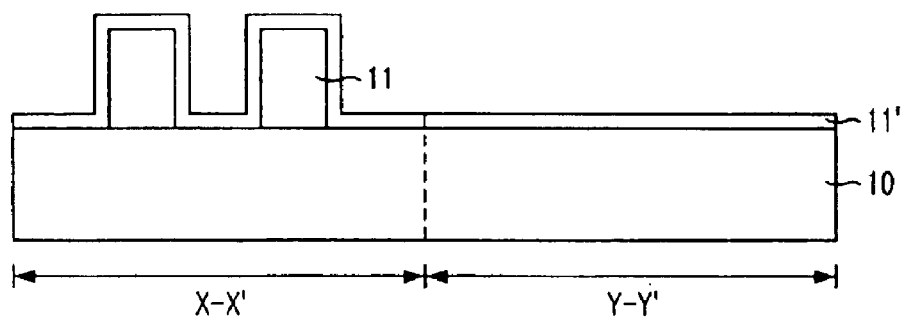
FIGS. 2A to 2F are cross-sectional views of the semiconductor device of FIG. 1 taken substantially along lines X–X' and Y–Y' of FIG. 1 at successive steps during the formation of the device.
Figure 2B:
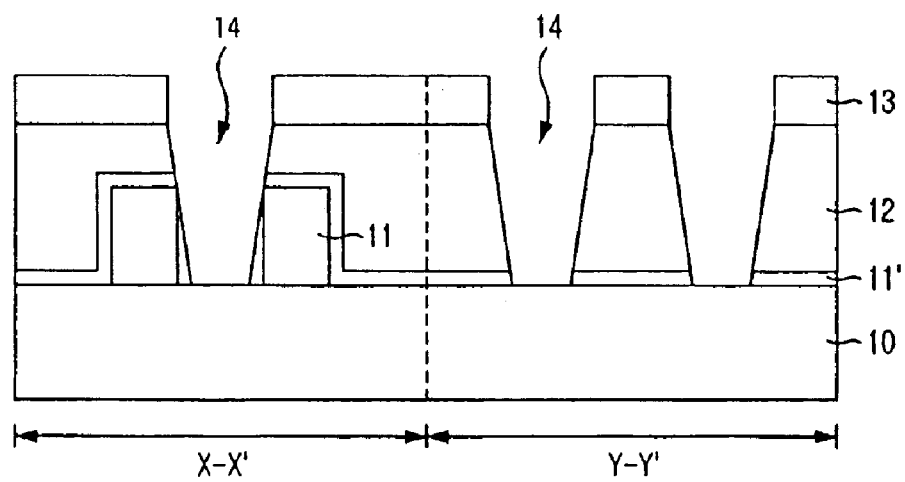
Figure 2C:
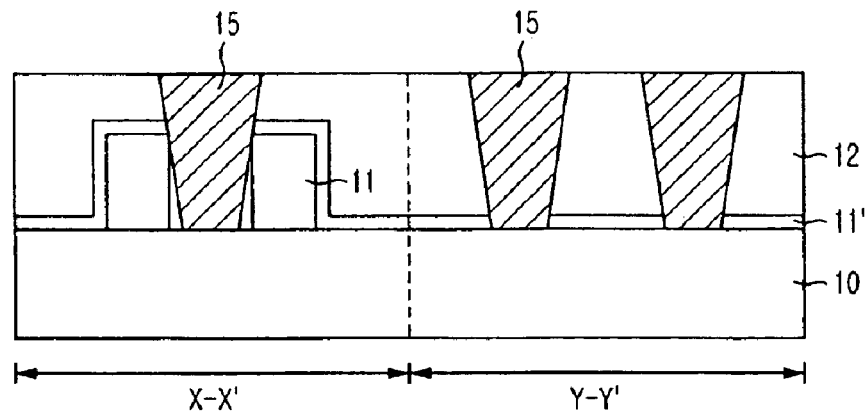
Figure 2D:
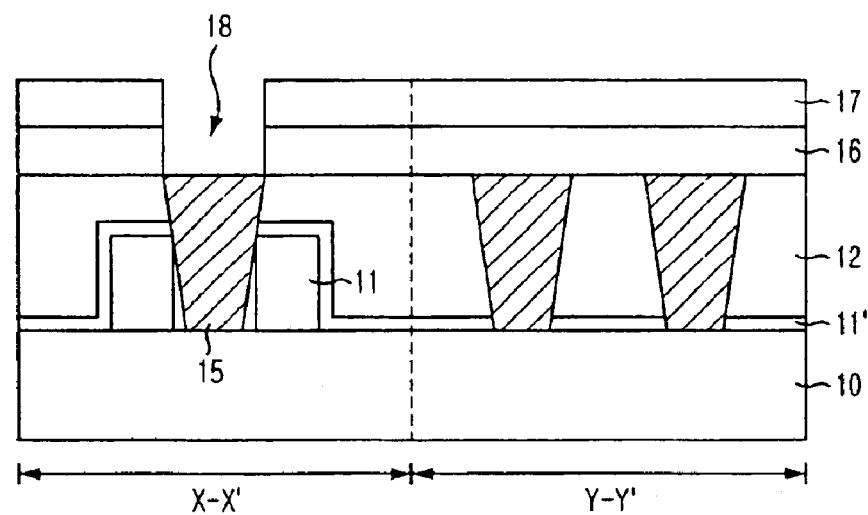
Figure 2E:
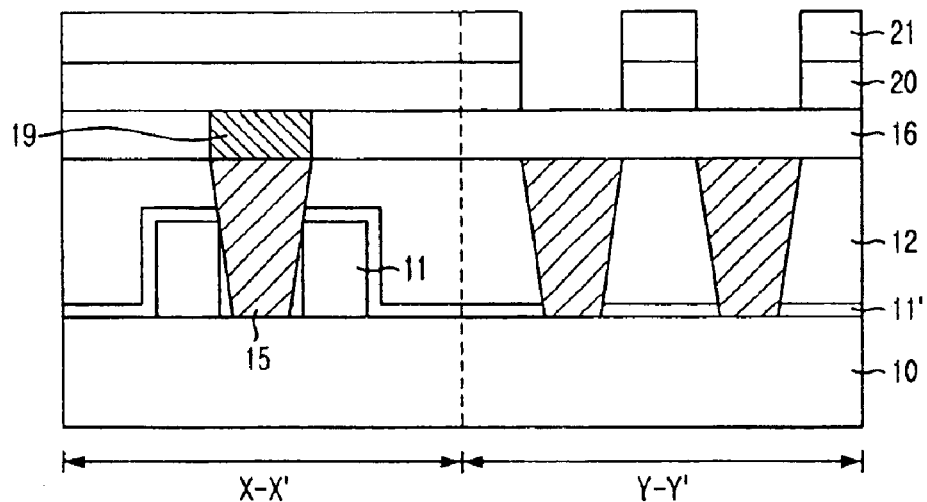
Figure 2F:
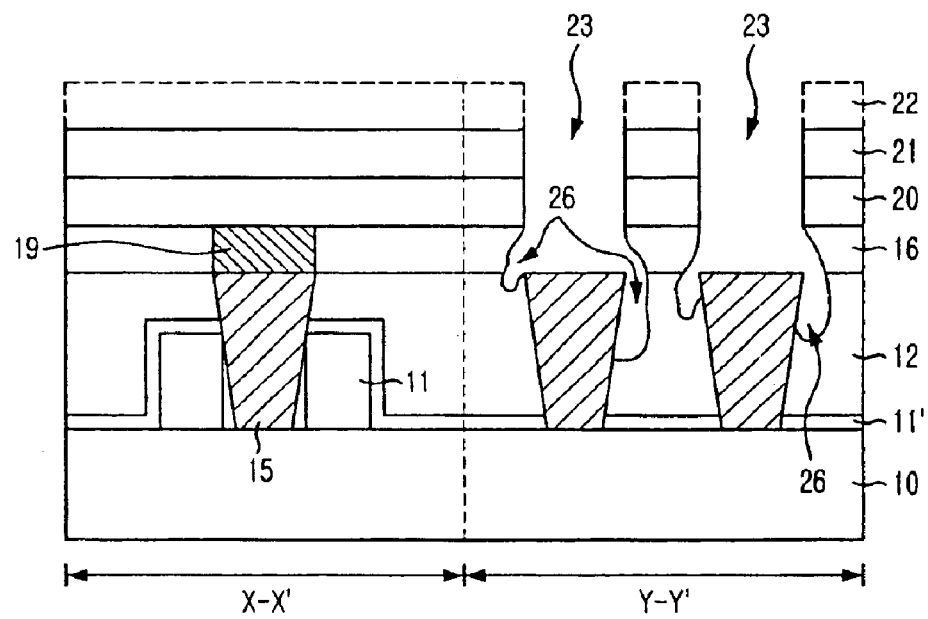
Figure 3:
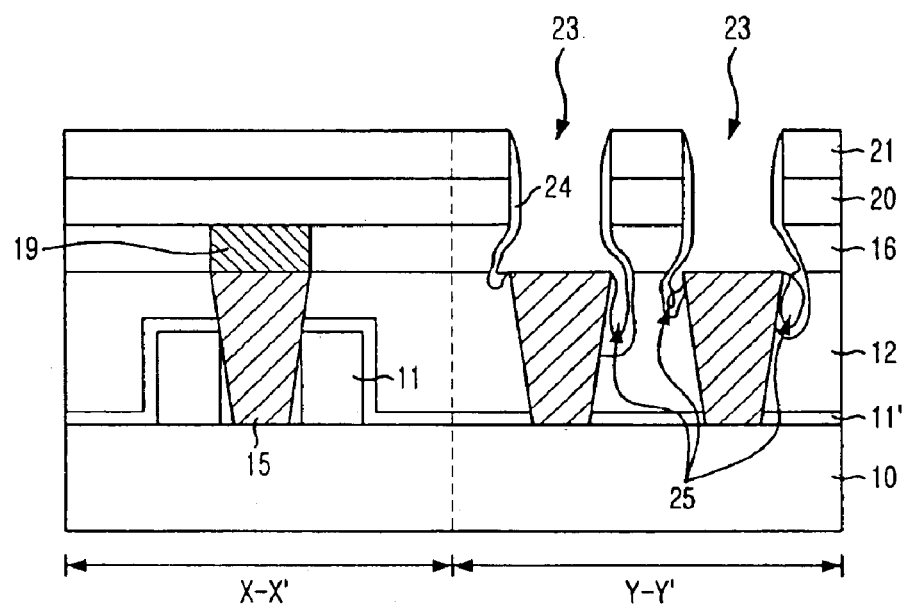
FIG. 3 is a diagram illustrating problems arising from the prior art processes illustrated in FIGS. 2A–2F.

For the sake of simplicity, FIGS. 1, 2A and 2B are also used in the following descriptions of the disclosed methods, and the same reference numerals are used to denote the corresponding structures in the following descriptions for the disclosed methods.

FIG. 1 is a plan view schematically illustrating a conductive pattern including a bit line and a word line.

As shown, a plurality of gate electrodes, e.g., word lines W/L, are aligned in one direction, and a plurality of bit lines B/L are aligned in a direction of crossing or intersecting the word lines W/L. A plurality of landing plug contacts (LPCs) are first formed by a LPC1 process. A bit line B/L is contacted to an active region (not shown) of a substrate through one of landing plug contacts (LPC) and a bit line contact (BLC). Some of the LPCs are coupled to storage node contacts (SNCs) in order to form storage node capacitors.

With reference to FIGS. 2A to 2B and FIGS. 4A to 4D, a method for fabricating a semiconductor device is disclosed in accordance with a first embodiment. FIGS. 2A to 2B are cross-sectional views taken along lines X–X' and Y–Y' shown of FIG. 1 after successive steps of the disclosed process.

Referring to FIG. 2A, a gate electrode 11 is formed on a substrate 10 containing various elements of the semiconductor device. In greater detail, the gate electrode 11 is formed with a single or stack layer of tungsten or polysilicon. A gate insulation layer (not shown) is formed at an interface between the gate electrode 11 and the substrate 10. On top of the gate electrode 11, a nitride- based hard mask (not shown) is formed from an oxide-based inter-layer insulation layer to protect the gate electrode 11 during a self align contact (SAC) process and to obtain an appropriate etch profile during the SAC process. The hard mask has a different etch selectivity than that gate electrode 11.

At this time, in 0.1 μm or below 0.1 μm technology, the total thickness of the gate electrode ranges from about 1000 Å to about 5000 Å, and that of the hard mask ranges from about 1000 Å to about 4000 Å.

Next, a technique such as an ion implantation technique is performed to form an impurity adhesion layer such as a source/drain adhesion, i.e., the active region (not shown) on a portion of the substrate 10 between the gate electrodes 11. A nitride-based insulation layer 11' for a spacer (hereinafter referred to as spacer insulation layer) is formed in such a manner to encompass lateral sides of the gate electrode 11.

A nitride-based insulation layer 11' for a spacer (hereinafter referred to as spacer insulation layer) is formed in such a manner so as to encompass the lateral sides of the gate electrode 11. This step is not illustrated in FIG. 2A for the sake of convenience.

Referring to FIG. 2B, a first inter-layer insulation layer 12 is formed of which a top portion is planarized. At this time, materials having an advanced planarization property as high density plasma (HDP), advanced planarization layer (APL), spin on dielectric (SOD), boro-phospho-silicate glass (BPSG), phospho-silicate glass (PSG) or boro- silicate glass (BSG) are used for the first inter-layer insulation layer. Particularly, the first inter-layer insulation layer 12 is deposited with a thickness ranging from about 1000 Å to about 10000 Å.

Continuous to the formation of the first inter-layer insulation layer 12, an anti-reflection layer (not shown), such as an organic anti-reflection layer, is coated on top of the first inter-layer insulation layer 12. Then, a photoresist is coated onto the anti-reflection layer and a photolithography process is performed with use of a light source of KrF or ArF to form a first photoresist pattern 13 for forming the LPCs.

The photoresist is coated on the anti-reflection layer with a predetermined thickness. Afterwards, a predetermined portion of the photoresist is selectively photo-exposed by using a light source such as ArF (not shown) and a predetermined reticle (not shown), and subsequently a developing process is performed on the remaining portions of the photoresist. Remnants produced during a subsequent etch process are removed through a cleaning process to thereby form the first photoresist pattern 13.

After the photoresist coating, an additional process such as an electron beam scanning or an ion implantation of Ar is performed to strengthen the tolerance of the first photoresist pattern 13 to a subsequent etch process.

Next, a LPC1 process is performed. That is, the first inter-layer insulation layer 12 is selectively etched with use of the first photoresist pattern 13 as an etch mask, and then, a number of contact holes 14 exposing a surface of the substrate 10 are formed.

Figure 4A:
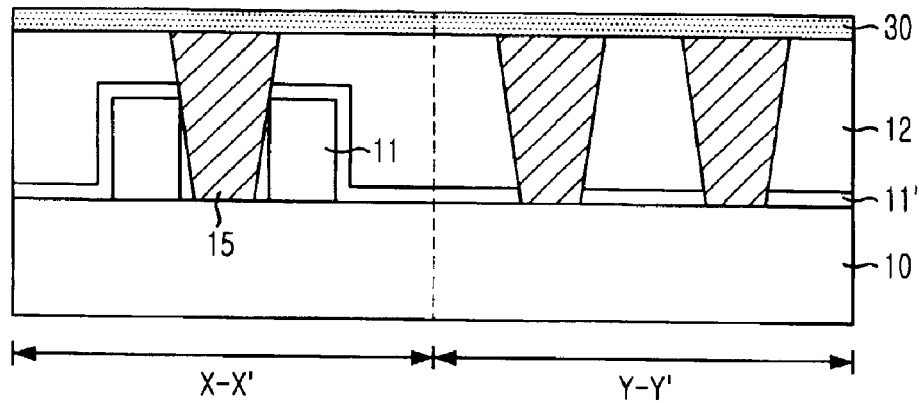
FIGS. 4A to 4D are cross-sectional views illustrating a method for fabricating a semiconductor device in accordance with a first disclosed method.

Referring to FIG. 4A, the first photoresist pattern 13 is removed through a photoresist strip process, and etch remnants existing within the contact hole 14 are removed by a cleaning process. Then, a contact material is placed within the contact hole 14 (see FIG. 2B) by using a polysilicon deposition or a selective epitaxial silicon growth technique.

Afterwards, a chemical mechanical polishing (CMP) process or a blanket-etch process is performed to form isolated plugs 15 (see FIG. 4A).

Still referring to FIG. 4A, an attack barrier layer 30 is formed on the above entire structure including the isolated plug 15. Herein, the attack barrier layer 30 prevents the first inter-layer insulation layer 12 from being attacked or eroded during the performing of a wet-type etching for a LPC2 process. Thus, a single application of a silicon nitride layer or a silicon oxynitride layer or a combination of these two layers is used for forming the attack barrier layer 30. These silicon nitride and silicon oxynitride layers have a higher etch tolerance to HF than oxide-based layers. Preferably, the attack barrier layer 30 is formed to have a thickness ranging from about 50 Å to about 1000 Å.

Figure 4B:
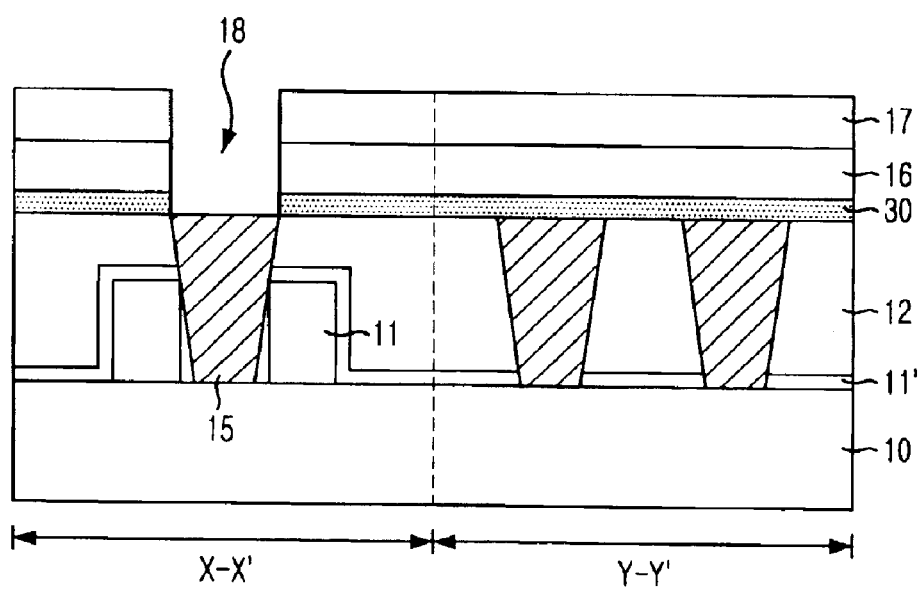

Referring to FIG. 4B, a second inter-layer insulation layer 16 is formed on the above structure. The second inter-layer insulation layer 16 uses boro-phospho-silicate glass (BPSG), low pressure tetra-ethyl-ortho silicate (LPTEOS), boro-silicate glass (BSG), phospho-silicate glass (PSG), plasma enhanced tetra ethyl ortho silicate (PETEOS), high density plasma (HDP), advanced planarization layer (APL) or spin on glass (SOG) and has a thickness ranging from about 1000 Å to about 10000 Å. A second photoresist pattern 17 for defining a bit line contact is formed thereafter. The second inter-layer insulation layer 16 is selectively etched by using the second photoresist pattern 17 as an etch mask so that a bit line contact hole 18 opening a surface of the plug 15 is formed.

Figure 4C:
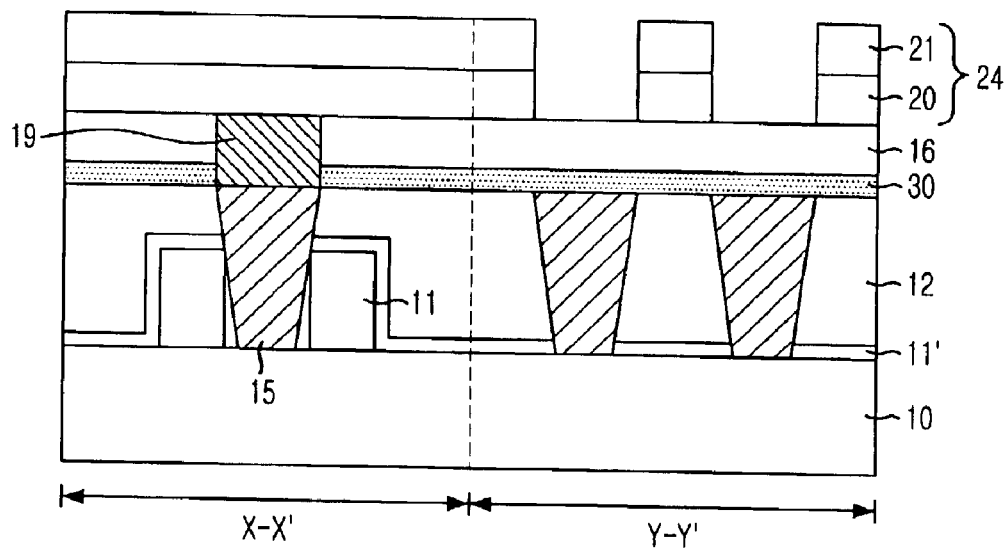

Next, as shown in FIG. 4C, a bit line contact plug 19 is formed on top of the opened plug 15. Subsequently, a layer 20 of tungsten, tungsten nitride, polycide or polysilicon and a nitride-based hard mask 21 are sequentially deposited to form a bit line 24. Herein, the bit line 24 is made of the same material used for the gate electrode 11, and the thickness of the bit line 24 is generally identical to that of the gate electrode 11.

Figure 4D:
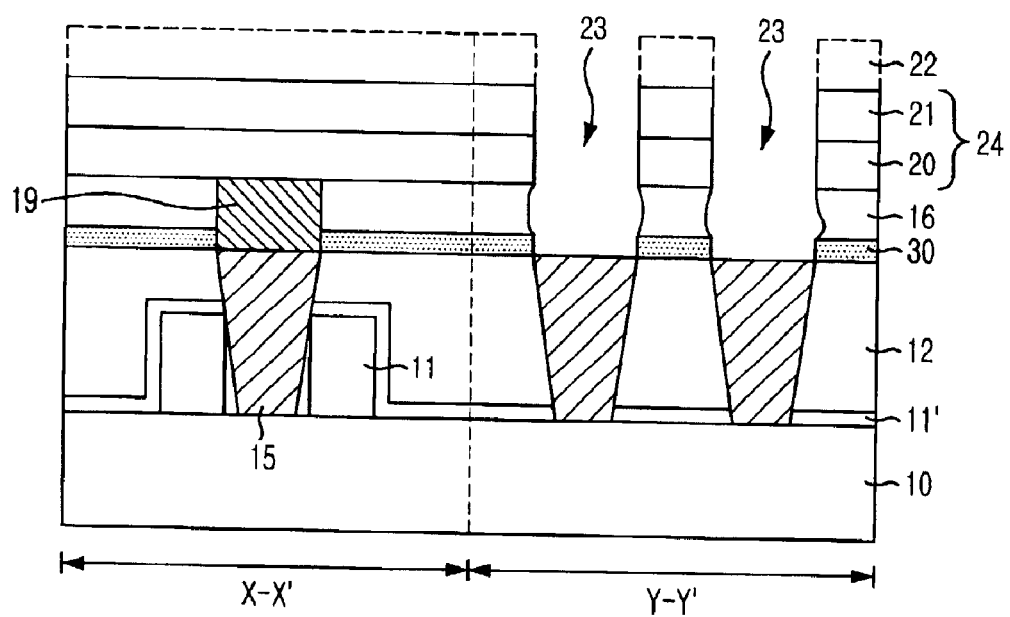

Referring to FIG. 4D, a third photoresist pattern 22 is formed for opening a surface of the plug 15 for a storage node contact (hereinafter referred as storage node contact plug). The photoresist pattern 22 is then used as an etch mask when the second inter-layer insulation layer 16 and the attack barrier layer 30 are selectively etched. From this selective etching of the second inter-layer insulation layer 16 and the attack barrier layer 30, a storage node contact hole 23 is formed. This process is referred as a LPC2 process.

Meanwhile, in ease of the LPC2 process for forming a storage node contact hole 23, the typical SAC process is used. Thus, an etch profile of the storage node contact hole 23 results in a slope thereby forming a narrower hole towards the bottom parts of the contact hole 23 thereby increasing the contact resistance of a later formed plug. As a result, in addition to the typical SAC process, a wet-type etch process is simultaneously performed during the LPC2 process in order to prevent such an increase in the contact resistance and to provide the generally vertical profile shown in FIG. 4D. Consequently, it is possible to obtain a larger contact area and critical dimension (CD).

Meanwhile, the attack barrier layer 30 acts as an etch barrier for preventing erosion of the first insulation layer 12 during the wet-type etch process. At the time of implementing the wet-type etch process, it is preferable to use a buffered oxide etchant (BOE) or diluted HF. Especially, the BOE contains aqueous ammonia and HF in a ratio of about 50:1 to about 1000:1. The diluted HF is obtained by mixing $H_2O$ with HF in a ratio of about 50:1 to about 1000:1.

The above wet-type etch process is an etch process with an application of a recipe for the typical SAC process. A first etch gas containing a high carbon ratio and polymers such as $C_3F_8$, $C_4F_8$, $C_5F_8$, $C_4F_6$, $C_3F_3$, and/or $C_2F_4$ is used to form the oxide-based second inter-layer insulation layer 16 and nitride-based layers, wherein an etch selectivity value of the oxide-based second inter-layer insulation layer 16 to the nitride-based layer or layers 30 is very high.

Also, a gas such as $CHF_3$, $C_2HF_5$, $CH_2F_2$, and/or $CH_3F$ is used as a second etch gas for securing the reliable etch process by increasing an etch process margin with the high etch selectivity value.

Also, a third etch gas can be used for improving an etch stop function by stabilizing plasma and enhancing a sputtering effect is such inert gas as He, Ne, Ar, Kr or Xe.

Meanwhile, the first to the third etch gases can be mixed and used as an etch gas, and it is also possible to add CxHyFz, where x, y, z is greater than or equal to 2, to the first etch gas in order to improve the process margin. During the forming of the contact holes, the dry-type etch process is performed to provide an inclined etch profile and then the wet-type etch process is performed to obtain a vertical etch profile.

In the first embodiment, the attack barrier layer 30 formed after the LPC1 process prevents the bottom insulation layers from being attacked or eroded in the course of performing the wet-type etch process.

FIGS. 5A to 5E are cross-sectional views of a semiconductor device made in accordance with a second embodiment.

For the sake of simplicity, FIG. 1 and FIG. 2A of the prior art are used in the drawings for the second preferred embodiment of the present invention, and those constitutional elements of the second preferred embodiment identical to the prior art are denoted using the same reference numerals.

Referring to FIG. 2A, a gate electrode 11 is formed on a substrate 10 containing various elements of a semiconductor device. An active region (not shown) is then formed by performing an ion implantation technique to a portion of the substrate 10 allocated between the gate electrodes 11.

Figure 5A:
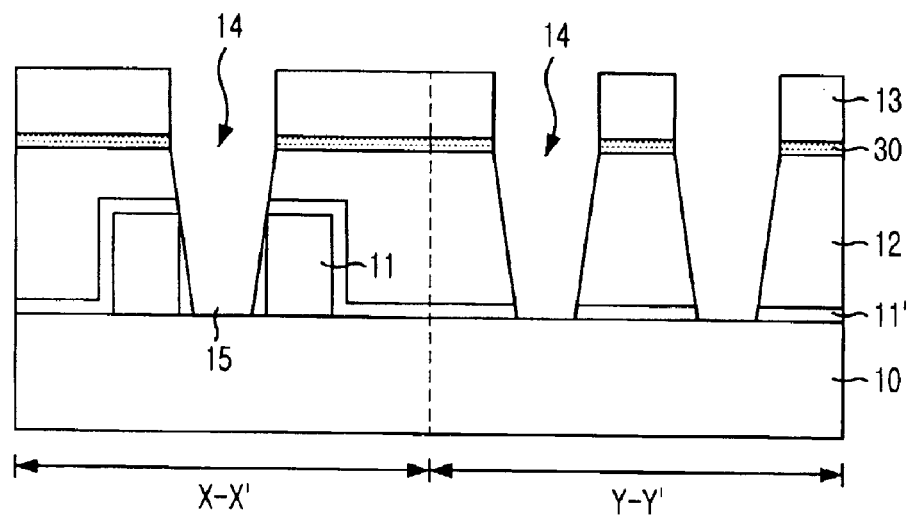
FIGS. 5A to 5E are cross-sectional views showing a method for fabricating a semiconductor device in accordance with a second disclosed method.

Referring to FIG. 5A, a first inter-layer insulation layer 12 of which top is planarized is formed. Continuous to the formation of the first inter-layer insulation layer 12, an attack barrier layer 30 is formed thereon. The attack barrier layer 30 is for preventing the attack to the first inter-layer insulation layer 12 along lateral sides of a plug 15 in the course of performing a wet-type etch process for obtaining a CD of a contact during a LPC2 process.

Therefore, the attack barrier layer 30 is formed by using solely a silicon nitride layer or a silicon oxynitride layer or by combining these two layers. Herein, these two layers have a higher etch tolerance to HF than oxide-based layers. Preferably, the attack barrier layer 30 has a thickness ranging from about 50 Å to about 1000 Å.

Continuous to the formation of the first inter-layer insulation layer 12, an anti-reflection layer (not shown), especially, an organic anti-reflection prevention layer is coated on top of the first inter-layer insulation layer 12. Then, a photoresist is coated on the anti-reflection layer is coated, and a photolithography process is performed with use of a light source of KrF or ArF to form a first photoresist pattern 13 for forming a landing plug contact (LPC).

The first photoresist pattern 13 formation processes is carried out as described with respect to the first preferred embodiment. Thus, the detailed description on the first photoresist pattern 13 formation will be omitted.

Next, a LPC1 process is performed. That is, the first inter-layer insulation layer 12 and the attack barrier layer 30 are selectively etched with use of the first photoresist pattern 13 as an etch mask so that a contact hole 14 exposing a surface of the substrate 10 is formed.

Figure 5B:
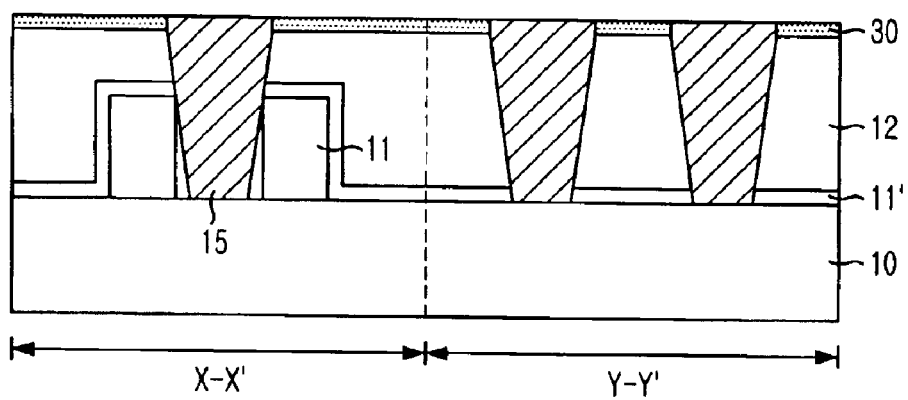

Referring to FIG. 5B, the first photoresist pattern 13 is removed through a photoresist strip process, and etch remnants existing within the contact hole 14 are removed by a cleaning process. Then, a contact material is deposited in the contact hole 14 by using a polysilicon deposition or a selective epitaxial silicon growth technique. Afterwards, a chemical mechanical polishing (CMP) process or a blank-etch process is performed to form an isolated plug 15. At this time, it is preferable to get the plug 15 and the attack barrier layer 30 planarized together.

Figure 5C:
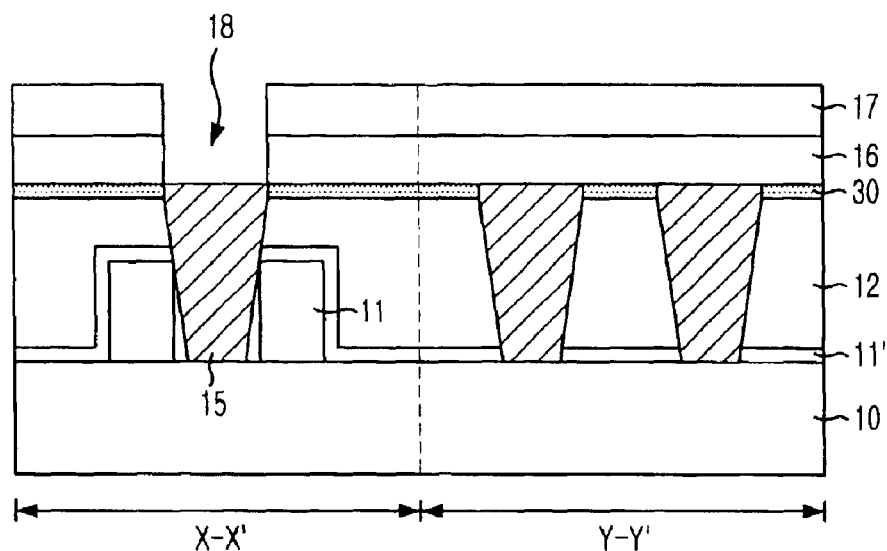

Referring to FIG. 5C, a second inter-layer insulation layer 16 is formed on the above entire structure including the plug 15 by using boro-phospho-silicate glass (BPSG), low pressure tetra-ethyl-ortho silicate (LPTEOS), boro-silicate glass (BSG), phospho-silicate glass (PSG), plasma enhanced tetra ethyl ortho silicate (PETEOS), high density plasma (HDP), advanced planarization layer (APL) or spin on glass (SOG). At this time, the second inter-layer insulation layer 16 has a thickness in a range from about 1000 Å to about 10000 Å. Then, a second photoresist pattern 17 for defining a bit line contact is formed. The second inter-layer insulation layer 16 is selectively etched with use of the photoresist pattern 17 as an etch mask to thereby form a bit line contact hole 18 exposing a surface of the plug 15.

Figure 5D:
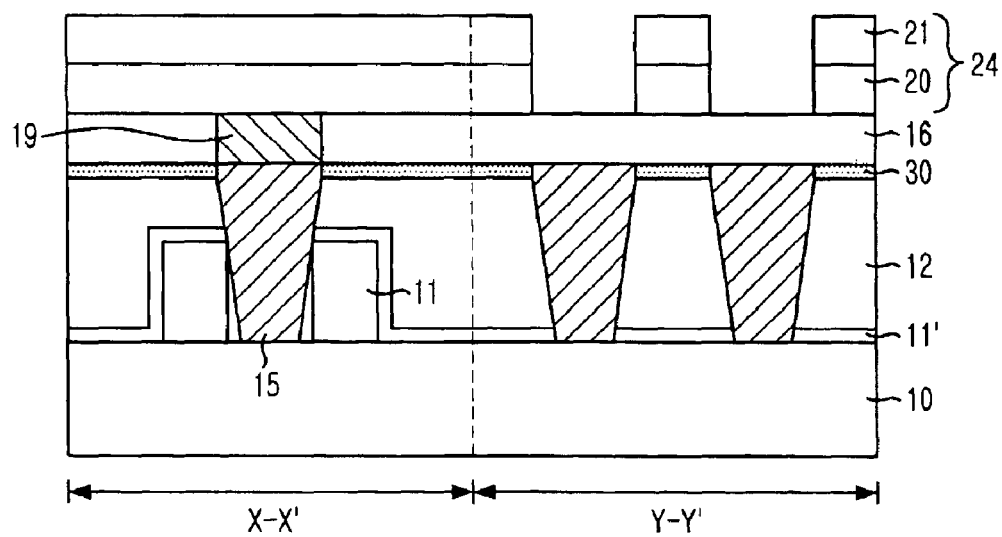
Figure 5E:
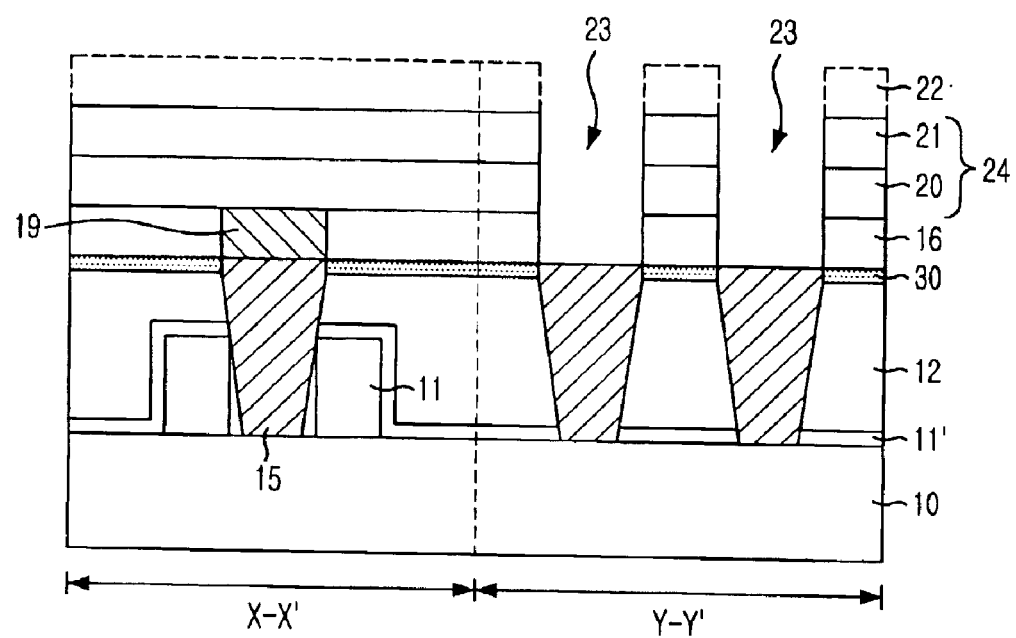

Referring to FIG. 5D, a bit line contact plug 19 is formed on a surface of the opened plug 15. Subsequently, a layer 20 made of tungsten, tungsten nitride, polycide or polysilicon and a nitride-based hard mask 21 are sequentially deposited to thereby form a bit line 24. Herein, the bit line 24 is made of the same material used for the gate electrode 11, and the thickness of the bit line 24 is similar to that of the gate electrode 11.

As shown, after the bit line 24 formation, a LPC2 process is performed. That is, a third photoresist pattern 22 is formed for opening a surface of the plug 15 for a storage node contact (hereinafter referred as storage node contact plug). The photoresist pattern 22 is then used as an etch mask when the second inter-layer insulation layer 16 is selectively etched. From this selective etching of the second inter-layer insulation layer 16, a storage node contact hole 23 is formed.

Meanwhile, in case of the LPC2 process for forming a SNC, the typical SAC process is used. As discussed above with respect to FIG. 4D, an etch profile of the storage node contact hole 23 would have a slope to form a narrower hole towards the bottom part[s ]of the etch profile. As a result, in addition to the typical SAC process, a wet-type etch process is simultaneously performed during the LPC2 process in order to prevent an increase in contact resistance and form a generally vertical profile for the contact hole 23. Consequently, it is possible to secure larger contact area, i.e., a CD.

Meanwhile, the attack barrier layer 30 acts as an etch barrier for preventing the attack to the first insulation layer 12 during the wet-type etch process. At the time of implementing the wet-type etch process, it is preferable to use a buffered oxide etchant (BOE) or diluted HF. Especially, the BOE contains aqueous ammonia and HF in a ratio of about 50:1 to about 1000:1. The diluted HF is obtained by mixing H2O with HF in a ratio of about 50:1 to about 1000:1.

The above wet-type etch process is an etch process with an application of a recipe for the typical SAC process. A first etch gas containing a high carbon ratio and polymers such as $C_3F_8$, $C_4F_8$, $C_5F_8$, $C_4F_6$ and/or $C_3F_3$ are used to form the oxide based second inter-layer insulation layer 16 and nitride based layers, wherein an etch selectivity value of the oxide-based second inter-layer insulation layer 16 to the nitride-based layer or layers 30 is a very value.

Also, a gas such as $CHF_3$, $C_2HF_5$, $CH_2F_2$, or $CH_3F$ is used as a second etch gas for securing the reliable etch process by increasing an etch process margin with the high etch selectivity value.

Also, a third etch gas can be used for improving an etch stop function by stabilizing plasma and enhancing a sputtering effect is such inert gas as He, Ne, Ar, Kr or Xe.

In the meantime, the first to the third etch gases can be mixed to be used as an etch gas, and it is also possible to add CxHyFz, where x, y, z is greater than or equal to 2, to the first etch gas in order to improve the process margin.

In the second embodiment, since the attack barrier layer 30 formed after the LPC1 process is planarized with the plug 15, it is possible to prevent the bottom insulation layers from being attacked in the course of performing the wet-type etch process.

The first and the second embodiments provide that an additional nitride based attack barrier layer is formed after the plug formation to prevent the attack or erosion of the lower insulation layer in the course of performing the wet-type etch process for increasing a contact area with a bottom side of the plug. From this effect, it is possible to secure an opening part to thereby increase yields of semiconductor devices in an effective manner.

While the disclosed methods have been described with respect to certain preferred embodiments, it will be apparent -to those skilled in the art that various changes and modifications may be made without departing from the scope of the invention as defined in the following claims.

What is claimed is:

1. A method for fabricating a semiconductor device comprising:
    forming a plurality of first plugs that extend through a first inter-layer insulation layer disposed on a substrate with the first plugs contacting the substrate;
    forming an attack barrier layer on the first inter-layer insulation layer;
    forming a second inter-layer insulation layer on the first plugs and the attack barrier layer;
    forming a conductive pattern on a first portion of the first plugs by selectively etching the second inter-layer insulation layer and the attack barrier layer leaving a second portion of the first plugs not in contact with the conductive pattern; and
    forming a contact holes that individually expose surfaces of second portion of the first plugs that are not in contact with the conductive pattern by etching selectively the second insulation layer with use of dry-type and wet-type etch processes,
    wherein the attack barrier layer prevents an attack or erosion of the first interlayer insulation layer in contact with the first plug during the wet-type etch process for forming the contact holes.

2. The method as recited in claim 1, wherein the attack barrier layer is formed on the first plugs after the forming of the first plugs, and the second inter-layer insulation layer and the attack barrier layer are etched during the forming of the contact holes.

3. The method as recited in claim 1, wherein during the forming of the contact holes, the dry-type etch process is performed to provide an inclined etch profile and then the wet-type etch process is performed to obtain a generally vertical final etch profile.

4. The method as recited in claim 1, wherein the attack barrier layer includes at least one layer selected from the group consisting of a silicon nitride layer, a silicon oxynitride layer and a combination of a silicon nitride layer and a silicon oxynitride layer.

5. The method as recited in claim 1, wherein the attack barrier layer has a thickness ranging from about 50 Å to about 1000 Å.

6. The method as recited in claim 1, wherein the wet-type etch process employs a buffered oxide etchant containing aqueous ammonia and HF in a ratio of about 50:1 to about 1000:1 or HF diluted with $H_2O$ in a ratio of about 50:1 to about 1000:1.

7. The method as recited in claim 1, further comprising forming a second plugs that are individually in contact with one of the second portion of the first plugs that are exposed by the contact holes.

8. The method as recited in claim 7, wherein the second plugs are storage node contact plugs.

9. A method for fabricating a semiconductor device comprising:
    forming a plurality of first plugs contacting a substrate by passing through a first inter-layer insulation layer disposed on the substrate;
    forming an attack barrier layer on the plurality of the first plugs and the first inter-layer insulation layer to prevent the first inter-layer insulation layer from being attacked during a subsequent wet-type etch process;
    forming a second inter-layer insulation layer on the attack barrier layer;
    forming a conductive pattern contacting a first group of the first plugs by passing through the second inter-layer insulation layer leaving a second group of the first plugs not in contact with the conductive pattern; and
    etching selectively the second inter-layer insulation layer and the attack barrier layer by employing a dry-type and a wet-type etch process to form a contact holes that individually expose a surface of one of second group of the first plugs that are not in contact with the conductive pattern.

10. The method as recited in claim 9, wherein during the forming of the contact holes, the dry-type etch process is carried out first and provides an inclined etch profile and then the wet-type etch process is then performed to obtain a generally vertical final profile.

11. The method as recited in claim 9, wherein the plurality of the first plugs are planarized with the first inter-layer insulation layer.

12. The method as recited in claim 9, wherein the attack barrier layer includes at least any one layer selected from a silicon nitride layer and a silicon oxynitride layer or a combination of a silicon nitride layer and a silicon oxynitride layer.

13. A method for fabricating a semiconductor device comprising:
    forming sequentially a first inter-layer insulation layer and an attack barrier layer on a substrate, the attack barrier layer preventing the first inter-layer insulation layer from being attacked during a subsequent wet-type etch process;
    forming a plurality of plugs of which top portion is planarized with the attack barrier layer, the plugs contacting the substrate by passing through the attack barrier layer and the first inter-layer insulation layer;

forming a second inter-layer insulation layer on the above entire structure including the plugs;

forming a conductive pattern in contact with some of the plurality of the plugs by passing through the second inter-layer insulation layer and leaving a remaining portion of the plugs not in contact with the conductive pattern; and etching selectively the second inter-layer insulation layer by using a dry-type and wet-type etch process to form contact holes individually exposing a surface of one of the plugs that are not in contact with the conductive pattern, wherein during the forming of the contact holes, the dry-type etch process is carried out first and provides an inclined etch profile and then the wet-type etch process is then performed to obtain a generally vertical final etch profile.

14. The method as recited in claim 13, wherein, during the forming of the contact holes, the dry-type etch process according to a self align contact (SAC) process is carried out and provides the inclinded etch profile and then the wet-type etch process is performed to expose surfaces of the plugs that are not in contact with the conductive pattern and convert the inclined etch profile to the generally vertical final etch profile.

15. The method as recited in claim 13, wherein the attack barrier layer includes at least one layer selected from a silicon nitride layer and a silicon oxynitride layer or a combination of a silicon nitride layer and a silicon oxynitride layer.

16. The method as recited in claim 13, wherein the first and the second inter-layer insulation layers are oxide based layers.

17. The method as recited in claim 16, wherein the first inter-layer insulation layer uses boro-phospho-silicate glass (BPSG), phospho-silicate glass (PSG), boro- silicate glass (BSG), high density plasma (HDP), advanced planarization layer (APL) or spin on dielectric (SOD) and the second inter-layer insulation layer uses boro-phospho-silicate glass (BPSG), low pressure tetra-ethyl-ortho silicate (LPTEOS), boro-silicate glass (BSG), phospho-silicate glass (PSG), plasma enhanced tetra ethyl ortho silicate (PETEOS), high density plasma (HDP), advanced planarization layer (APL) or spin on glass (SOG).

18. A method for fabricating a semiconductor device comprising:

forming a plurality of first plugs that extend through a first inter-layer insulation layer disposed on a substrate, with the first plugs contacting the substrate;

forming an attack barrier layer on the first inter-layer insulation layer;

forming a second inter-layer insulation layer on the first plugs and the attack barrier layer;

forming a conductive pattern on a first portion of the first plugs after selectively etching the second inter-layer insulation layer and the attack barrier layer leaving a second portion of the first plugs not in contact with the conductive pattern; and forming contact holes exposing surfaces of the second portion of the first plugs by etching selectively the second insulation layer with use of both dry-type and wet-type etch processes, wherein the attack barrier layer prevents an attack or erosion of the first interlayer insulation layer contacting the first plugs during the wet-type etch process for forming the contact holes, and during the forming of the contact holes, the dry-type etch process is performed to provide an inclined etch profile and then the wet-type etch process is performed to obtain a resulting vertical etch profile.

19. A method for fabricating a semiconductor device comprising:

forming a plurality of first plugs contacting a substrate by extending through a first inter-layer insulation layer disposed on the substrate;

forming an attack barrier layer on the plurality of the first plugs to prevent the first inter-layer insulation layer from being attacked during a subsequent wet-type etch process;

forming a second inter-layer insulation layer on the attack barrier layer;

forming a conductive pattern contacted to a first portion of the first plugs by passing through the second inter-layer insulation layer leaving a second portion of the first plugs not in contact with the conductive pattern; and etching selectively the second inter-layer insulation layer and the attack barrier layer by employing a dry-type and a wet-type etch process to form contact holes exposing surfaces of the second portion of the first plugs, wherein during the formation of the contact holes, a first dry-type etch process provides an inclined etch profile and then the subsequent wet-type etch process is performed to obtain a resulting vertical profile.

20. A method for fabricating a semiconductor device comprising:

forming sequentially a first inter-layer insulation layer and an attack barrier layer on a substrate, the attack barrier layer for preventing the first inter-layer insulation layer from being attacked during a subsequent wet-type etch process;

forming a plurality of plugs of which top portion is planarized with the attack barrier layer, the plugs contacting the substrate by passing through the attack barrier layer and the first inter-layer insulation layer;

forming a second inter-layer insulation layer on the above entire structure including the plugs;

forming a conductive pattern contacting some of the plugs by passing through the second inter-layer insulation layer leaving a remaining portion of the plug not in contact with the conductive pattern; and etching selectively the second inter-layer insulation layer by using a dry-type and then a wet-type etch process to form contact holes exposing surfaces of remaining portion the plugs that are not in contact with the conductive pattern wherein, during the forming of the contact holes, the dry-type etch process is carried out according to a self align contact (SAC) process to provide an inclined etch profile and then the wet-type etch process is performed to make the etch profile vertical and expose the surfaces of the remaining portion of the plugs.

* * * * *

UNITED STATES PATENT AND TRADEMARK OFFICE
CERTIFICATE OF CORRECTION

PATENT NO.   : 6,852,592 B2
DATED        : February 8, 2005
INVENTOR(S)  : Sung-Kwon Lee et al.

It is certified that error appears in the above-identified patent and that said Letters Patent is hereby corrected as shown below:

Column 9,
Line 52, please delete "forming a contact" and insert -- forming contact -- in its place.

Column 10,
Line 17, please delete "forming a second" and insert -- forming second -- in its place.
Line 40, after "etch process to" please delete "form a contact" and insert -- form contact -- in its place.

Signed and Sealed this

Twenty-fourth Day of May, 2005

JON W. DUDAS
*Director of the United States Patent and Trademark Office*